(12) United States Patent
Hashizume

(10) Patent No.: US 10,903,091 B2
(45) Date of Patent: Jan. 26, 2021

(54) SUBSTRATE PROCESSING APPARATUS AND SUBSTRATE PROCESSING METHOD

(71) Applicant: SCREEN Holdings Co., Ltd., Kyoto (JP)

(72) Inventor: Akio Hashizume, Kyoto (JP)

(73) Assignee: SCREEN Holdings Co., Ltd.

( * ) Notice: Subject to any disclaimer, the term of this patent is extended or adjusted under 35 U.S.C. 154(b) by 389 days.

(21) Appl. No.: 15/743,967

(22) PCT Filed: Apr. 21, 2016

(86) PCT No.: PCT/JP2016/062655
§ 371 (c)(1),
(2) Date: Jan. 11, 2018

(87) PCT Pub. No.: WO2017/029838
PCT Pub. Date: Feb. 23, 2017

(65) Prior Publication Data
US 2018/0197756 A1   Jul. 12, 2018

(30) Foreign Application Priority Data

Aug. 18, 2015   (JP) .................................. 2015-161294

(51) Int. Cl.
*H01L 21/67*   (2006.01)
*H01L 21/02*   (2006.01)
*H01L 21/304*   (2006.01)

(52) U.S. Cl.
CPC .. *H01L 21/67051* (2013.01); *H01L 21/02052* (2013.01); *H01L 21/02057* (2013.01);
(Continued)

(58) Field of Classification Search
CPC ................................................ H01L 21/67051
See application file for complete search history.

(56) References Cited

U.S. PATENT DOCUMENTS 4,788,043 A * 11/1988 Kagiyama ................ B01D 3/36
                                                      134/109
5,243,768 A    9/1993 Fukao et al. ...................... 34/22
(Continued)

FOREIGN PATENT DOCUMENTS

JP    H05-90240 A    4/1993
JP    2009-110985 A    5/2009
(Continued)

OTHER PUBLICATIONS

International Preliminary Report on Patentability (Chapter I) with Notification from the International Bureau Form PCT/IB/326 for International Application No. PCT/JP2016/062655 dated Mar. 1, 2018.
(Continued)

*Primary Examiner* — Jason Y Ko
(74) *Attorney, Agent, or Firm* — Ostrolenk Faber LLP

(57) ABSTRACT

According to the present invention, after supplying a rinse liquid containing water to a substrate that is held horizontally, an IPA-containing liquid which contains isopropyl alcohol is supplied to the substrate to which the rinse liquid adhering. Subsequently, an IPA-containing liquid low in moisture concentration is supplied to the substrate. The IPA-containing liquid which has been supplied to the substrate is recovered and supplied to the substrate again.

7 Claims, 4 Drawing Sheets

(52) U.S. Cl.
CPC ...... *H01L 21/304* (2013.01); *H01L 21/67017* (2013.01); *H01L 21/67028* (2013.01)

(56) References Cited

U.S. PATENT DOCUMENTS

| | | |
|---|---|---|
| 8,607,807 B2 | 12/2013 | Higashijima et al. ..... 134/102.1 |
| 2006/0163205 A1 | 7/2006 | Niuya et al. ..................... 216/83 |
| 2007/0045161 A1 | 3/2007 | Aihara .......................... 210/150 |
| 2011/0297192 A1 | 12/2011 | Ogata et al. ................. 134/94.1 |
| 2015/0013798 A1 | 1/2015 | Murayama et al. ..... 137/599.11 |

FOREIGN PATENT DOCUMENTS

| | | | |
|---|---|---|---|
| JP | 2010-192566 A | 9/2010 |
| JP | 2013-173678 A | 9/2013 |
| KR | 10-1524903 B1 | 6/2015 |
| TW | 200300573 A | 6/2003 |
| TW | 200807528 A | 2/2008 |

OTHER PUBLICATIONS

English translation of the International Preliminary Report on Patentability (Chapter I) with Notification from the International Bureau Form PCT/IB/338 International Application No. PCT/JP2016/062655 dated Mar. 1, 2018.
International Search Report dated Aug. 2, 2016 in corresponding PCT International Application No. PCT/JP2016/062655.
Written Opinion dated Aug. 2, 2016 in corresponding PCT International Application No. PCT/JP2016/062655.

\* cited by examiner

SUBSTRATE PROCESSING APPARATUS AND SUBSTRATE PROCESSING METHOD

CROSS-REFERENCE TO RELATED APPLICATIONS

The present application is a 35 U.S.C. §§ 371 national phase conversion of PCT/JP2016/062655, filed Apr. 21, 2016, which claims priority to Japanese Patent Application No. 2015-161294, filed Aug. 18, 2015, the contents of both of which are incorporated herein by reference. The PCT International Application was published in the Japanese language.

TECHNICAL FIELD

The present invention relates to a substrate processing apparatus and a substrate processing method that process a substrate. Substrates to be processed include, for example, semiconductor wafers, substrates for liquid crystal displays, substrates for plasma displays, substrates for FEDs (field emission displays), substrates for optical disks, substrates for magnetic disks, substrates for magneto-optical disks, substrates for photomasks, ceramic substrates, substrates for solar cells, etc.

BACKGROUND ART

Patent Document 1 discloses a steam dryer which uses steam of IPA (isopropyl alcohol) to dry an object to be dried after the object is cleaned with water. The steam dryer includes a membrane separator which separates water from IPA supplied to the object to be dried such as a semiconductor wafer. In the steam dryer, IPA is evaporated by a steam generating portion disposed below the object to be dried, and steam of IPA is brought into contact with the object to be dried after cleaning with water. A liquid of IPA which has been condensed on a surface of the object to be dried flows down together with moisture adhering to the object to be dried and mixes with the liquid of IPA at the steam generating portion. Moisture contained in IPA is removed by the membrane separator arranged at the steam generating portion.

PRIOR ART DOCUMENT

Patent Document

PATENT DOCUMENT 1: JP H05-90240 A

SUMMARY OF THE INVENTION

Problem(s) to be Solved by the Invention

Patent Document 1 discloses after the IPA is used removing moisture contained in a liquid of IPA in order to supply steam of the IPA low in moisture concentration to an object to be dried. However, Patent Document 1 does not disclose efficiently supplying the IPA low in moisture concentration.

That is, if the moisture concentration of IPA is low at the end of supplying IPA despite the fact that the moisture concentration thereof is high at the start of supplying IPA, it is possible to reduce a quantity of water remaining in an object to be dried after supplying IPA and also suppress or prevent occurrence of abnormalities resulting from remaining moisture such as watermarks and pattern collapse. It is also possible to reduce a used quantity of IPA low in moisture concentration, as compared with a case where the IPA low in moisture concentration is supplied from the beginning.

Although Patent Document 1 discloses removing moisture contained in a liquid of IPA, it is not disclosed that in a period of time during which steam of IPA is being supplied to an object to be dried, lowering the moisture concentration of IPA as the time elapses. In Patent Document 1, IPA low in moisture concentration is supplied to a substrate at the start of supplying IPA.

Thus, one object of the present invention is to efficiently supply IPA low in moisture concentration to a substrate while reducing the consumption of the IPA.

Means for Solving the Problem

A preferred embodiment of the present invention provides a substrate processing apparatus which supplies a substrate held horizontally with an IPA-containing liquid containing isopropyl alcohol and includes a substrate holding unit which holds the substrate horizontally, a rinse liquid supplying unit which supplies a rinse liquid containing water to the substrate held by the substrate holding unit, a first IPA supplying system which supplies the IPA-containing liquid to the substrate held by the substrate holding unit, a second IPA supplying system which supplies an IPA-containing liquid lower in moisture concentration than the IPA-containing liquid supplied by the first IPA supplying system to the substrate held by the substrate holding unit, a recovery unit which recovers the IPA-containing liquid supplied to the substrate held by the substrate holding unit in both the first IPA supplying system and the second IPA supplying system or in the first IPA supplying system, and a controller which controls the rinse liquid supplying unit, the first IPA supplying system, the second IPA supplying system and the recovery unit. The controller executes a rinse liquid supplying process which causes the rinse liquid supplying unit to supply the rinse liquid to the substrate, a first IPA supplying process which causes the first IPA supplying system to supply the IPA-containing liquid to the substrate to which the rinse liquid is adhering after the rinse liquid supplying process, a second IPA supplying process which causes the second IPA supplying system to supply the IPA-containing liquid to the substrate after the first IPA supplying process, and a recovery process which causes the recovery unit to recover the IPA-containing liquid supplied to the substrate in at least one of the first IPA supplying process and the second IPA supplying process.

With this arrangement, after the rinse liquid containing water has been supplied to the substrate, the IPA-containing liquid which contains isopropyl alcohol is supplied to the substrate. Moisture concentration of the IPA-containing liquid to be supplied to the substrate is reduced during supply of the IPA-containing liquid. Therefore, as compared with a case where the IPA-containing liquid low in moisture concentration is supplied at the start of supplying the IPA-containing liquid, it is possible to efficiently supply the IPA-containing liquid low in moisture concentration to the substrate. Thereby, it is possible to reduce a quantity of water remaining in the substrate after supply of the IPA-containing liquid and also possible to suppress or prevent occurrence of abnormalities resulting from remaining moisture such as watermarks and pattern collapse. Further, the IPA-containing liquid is recovered in order to supply it to the substrate, and it is thus possible to reduce consumption of the IPA-containing liquid.

In the preferred embodiment, at least one of the following features may be added to the substrate processing apparatus.

The substrate processing apparatus further includes a drain unit which expels from the recovery unit the IPA-containing liquid supplied to the substrate held by the substrate holding unit before being recovered in both of the first IPA supplying system and the second IPA supplying system or in the first IPA supplying system, the controller further executes a drain process which causes the drain unit to expel the IPA-containing liquid supplied to the substrate in the first IPA supplying process before the recovery process.

The IPA-containing liquid supplied to the substrate at the start of supplying the IPA-containing liquid is expelled from the substrate together with the rinse liquid. At this time, a liquid expelled from the substrate contains the rinse liquid at a high percentage. With this arrangement, the IPA-containing liquid supplied to the substrate at the start of supplying the IPA-containing liquid is not recovered but expelled. Therefore, it is possible to suppress or prevent the recovery of IPA-containing liquid high in moisture concentration.

The first IPA supplying system includes a first retention tank which retains the IPA-containing liquid supplied to the substrate held by the substrate holding unit, the recovery unit is connected to the first retention tank and includes an intermediate tank which retains the IPA-containing liquid supplied to the substrate held by the substrate holding unit, the recovery process includes a retention process which retains in the intermediate tank the IPA-containing liquid supplied to the substrate in at least one of the first IPA supplying process and the second IPA supplying process, and a supplying process which supplies to the first retention tank the IPA-containing liquid inside the intermediate tank after the first IPA supplying process and the second IPA supplying process.

With this arrangement, the IPA-containing liquid supplied to the substrate is retained in the intermediate tank. Then, after supply of the IPA-containing liquid is stopped, the IPA-containing liquid inside the intermediate tank is supplied to the first retention tank. If the IPA-containing liquid after use is mixed with the IPA-containing liquid inside the first retention tank during supply of the IPA-containing liquid, the IPA-containing liquid supplied to the substrate is decreased in purity. Therefore, after supply of the IPA-containing liquid to the substrate is stopped, the IPA-containing liquid after use is recovered in the first retention tank, thus making it possible to prevent a decrease in purity of the IPA-containing liquid supplied to the substrate during supply of the IPA-containing liquid.

The substrate processing apparatus further includes a dehydration unit which removes moisture from the IPA-containing liquid recovered by the recovery unit, at least one of the first IPA supplying system and the second IPA supplying system includes an IPA nozzle which discharges the IPA-containing liquid to the substrate held by the substrate holding unit, a retention tank which retains the IPA-containing liquid supplied toward the IPA nozzle, a circulation piping which defines an annular circulation channel to circulate the IPA-containing liquid inside the retention tank, and a supply piping which guides the IPA-containing liquid from the circulation piping toward the IPA nozzle, the dehydration unit includes an upstream dehydration unit arranged on the circulation piping and a downstream dehydration unit arranged on the supply piping.

With this arrangement, the IPA-containing liquid inside the retention tank circulates through a circulation channel formed by the retention tank and the circulation piping. In the meantime, the IPA-containing liquid is repeatedly dehydrated by the upstream dehydration unit. Further, the IPA-containing liquid inside the retention tank is dehydrated not only by the upstream dehydration unit but also by the downstream dehydration unit and, thereafter, supplied to the IPA nozzle. Therefore, it is possible to further reduce moisture concentration of the IPA-containing liquid supplied to the substrate.

The substrate processing apparatus further includes a dehydration unit which removes moisture from the IPA-containing liquid recovered by the recovery unit, the first IPA supplying system supplies the substrate held by the substrate holding unit with the IPA-containing liquid dehydrated by the dehydration unit, and the second IPA supplying system supplies the substrate held by the substrate holding unit with an IPA-containing liquid which is not yet used and lower in moisture concentration than the IPA-containing liquid supplied by the first IPA supplying system. The IPA-containing liquid which is not yet used means an IPA-containing liquid low in moisture concentration which is not supplied to the substrate by the substrate processing apparatus according to the present preferred embodiment.

With this arrangement, after the IPA-containing liquid which has been recovered and dehydrated is supplied to the substrate to which a rinse liquid is adhering, the IPA-containing liquid which is not yet used and low in moisture concentration is supplied to the substrate. Therefore, as compared with a case where the IPA-containing liquid which is not yet used is supplied from the beginning, the IPA-containing liquid low in moisture concentration can be efficiently supplied to the substrate. Further, since the IPA-containing liquid which has been recovered and dehydrated is supplied to the substrate before supply of the IPA-containing liquid which is not yet used, the IPA-containing liquid to be supplied to the substrate can be kept low in moisture concentration, while the IPA-containing liquid which is not yet used is reduced in consumption. It is thereby possible to further reduce a final remaining quantity of water.

The substrate processing apparatus further includes a dehydration unit which removes moisture from the IPA-containing liquid recovered by the recovery unit, the first IPA supplying system supplies the substrate held by the substrate holding unit with the IPA-containing liquid dehydrated by the dehydration unit, and the second IPA supplying system supplies the substrate held by the substrate holding unit with an IPA-containing liquid dehydrated by the dehydration unit and lower in moisture concentration than the IPA-containing liquid supplied by the first IPA supplying system.

With this arrangement, after the IPA-containing liquid which has been recovered and dehydrated is supplied to the substrate to which a rinse liquid is adhering, the IPA-containing liquid which has been recovered and dehydrated and which is low in moisture concentration is supplied to the substrate. Therefore, as compared with a case where the IPA-containing liquid low in moisture concentration is supplied from the beginning, the IPA-containing liquid low in moisture concentration can be efficiently supplied to the substrate. It is also possible to further reduce consumption of the IPA-containing liquid due to supply of the recovered IPA-containing liquid from the beginning.

The substrate processing apparatus further includes a dehydration unit which removes moisture from the IPA-containing liquid recovered by the recovery unit, the first IPA supplying system supplies the substrate held by the substrate holding unit with an IPA-containing liquid which has been recovered by the recovery unit but which is not dehydrated, and the second IPA supplying system supplies the substrate held by the substrate holding unit with an IPA-containing liquid which has been dehydrated by the dehydration unit and which is lower in moisture concentration than the IPA-containing liquid supplied by the first IPA supplying system.

With this arrangement, after the IPA-containing liquid which has been recovered but which is not dehydrated is supplied to the substrate to which a rinse liquid is adhering, the IPA-containing liquid which has been recovered and dehydrated and which is low in moisture concentration is supplied to the substrate. Therefore, as compared with a case where the IPA-containing liquid which has been recovered and dehydrated is supplied from the beginning, the IPA-containing liquid low in moisture concentration can be efficiently supplied to the substrate. It is also possible to further reduce consumption of the IPA-containing liquid due to supply of the recovered IPA-containing liquid from the beginning.

The first IPA supplying system supplies to the substrate held by the substrate holding unit the IPA-containing liquid which has been recovered by the recovery unit but which is not dehydrated, and the second IPA supplying system supplies the substrate held by the substrate holding unit with an IPA-containing liquid which is not yet used and lower in moisture concentration than the IPA-containing liquid supplied by the first IPA supplying system.

With this arrangement, after the IPA-containing liquid which has been recovered but which is not dehydrated is supplied to the substrate to which a rinse liquid is adhering, the IPA-containing liquid which is not yet used and low in moisture concentration is supplied to the substrate. Therefore, as compared with a case where the IPA-containing liquid which is not yet used is supplied from the beginning, the IPA-containing liquid low in moisture concentration can be efficiently supplied to the substrate. Since no dehydration unit is needed for dehydrating the IPA-containing liquid which has been recovered, it is also possible to further suppress an increase in manufacturing cost of the substrate processing apparatus.

Another preferred embodiment of the present invention provides a substrate processing method which supplies an IPA-containing liquid which contains isopropyl alcohol to a substrate held horizontally, and the substrate processing method includes a rinse liquid supplying process which supplies a rinse liquid containing water to the substrate, a first IPA supplying process which supplies the IPA-containing liquid to the substrate to which a rinse liquid is adhering after the rinse liquid supplying process, a second IPA supplying process which supplies the substrate with an IPA-containing liquid lower in moisture concentration than the IPA-containing liquid supplied in the first IPA supplying process after the first IPA supplying process, and a recovery process which recovers the IPA-containing liquid supplied to the substrate in at least one of the first IPA supplying process and the second IPA supplying process. According to this method, the effects described above can be obtained.

In the preferred embodiment, at least one of the following features may be added to the substrate processing method.

The substrate processing method further includes a drain process which does not recover but expels the IPA-containing liquid supplied to the substrate in the first IPA supplying process before the recovery process. According to this method, the effects described above can be obtained.

The recovery process includes a retention process which retains in an intermediate tank the IPA-containing liquid supplied to the substrate in at least one of the first IPA supplying process and the second IPA supplying process, and a supplying process which supplies after the first IPA supplying process and the second IPA supplying process the IPA-containing liquid inside the intermediate tank to a first retention tank of retaining the IPA-containing liquid supplied in the first IPA supplying process. According to this method, the effects described above can be obtained.

The substrate processing method further includes a dehydration process which removes moisture from the IPA-containing liquid which has been recovered in the recovery process, the dehydration process includes an upstream dehydration process which removes moisture from the IPA-containing liquid inside a circulation piping which defines an annular circulation channel to circulate the IPA-containing liquid and a downstream dehydration process which removes moisture from the IPA-containing liquid inside a supply piping which guides the IPA-containing liquid from the circulation piping toward an IPA nozzle which discharges the IPA-containing liquid to the substrate. According to this method, the effects described above can be obtained.

The substrate processing method further includes a dehydration process which removes moisture from the IPA-containing liquid which has been recovered in the recovery process, the first IPA supplying process supplies the substrate with an IPA-containing liquid which has been recovered and dehydrated, and the second IPA supplying system supplies the substrate with an IPA-containing liquid which is not yet used and lower in moisture concentration than the IPA-containing liquid supplied in the first IPA supplying process. According to this method, the effects described above can be obtained.

The substrate processing method further includes a dehydration process which removes moisture from the IPA-containing liquid which has been recovered in the recovery process, the first IPA supplying process supplies to the substrate the IPA-containing liquid which has been recovered and dehydrated, and the second IPA supplying process supplies the substrate with an IPA-containing liquid which been recovered and dehydrated and which is lower in moisture concentration than the IPA-containing liquid supplied in the first IPA supplying process. According to this method, the effects described above can be obtained.

The substrate processing method further includes a dehydration process which removes moisture from some of the IPA-containing liquid which has been recovered in the recovery process, the first IPA supplying process supplies the substrate with an IPA-containing liquid which has been recovered but which is not dehydrated, and the second IPA supplying process supplies the substrate with an IPA-containing liquid which has been recovered and dehydrated and which is lower in moisture concentration than the IPA-containing liquid supplied in the first IPA supplying process. According to this method, the effects described above can be obtained.

The first IPA supplying process supplies to the substrate the IPA-containing liquid which has been recovered but which is not dehydrated, the second IPA supplying process supplies the substrate with an IPA-containing liquid which is not yet used and lower in moisture concentration than the IPA-containing liquid supplied in the first IPA supplying process. According to this method, the effects described above can be obtained.

The above and other objects, features, and effects of the present invention will become more apparent from the

DESCRIPTION OF PREFERRED EMBODIMENTS

In the following description, IPA means a liquid which is mainly composed of isopropyl alcohol, unless otherwise specified.

Figure 1:
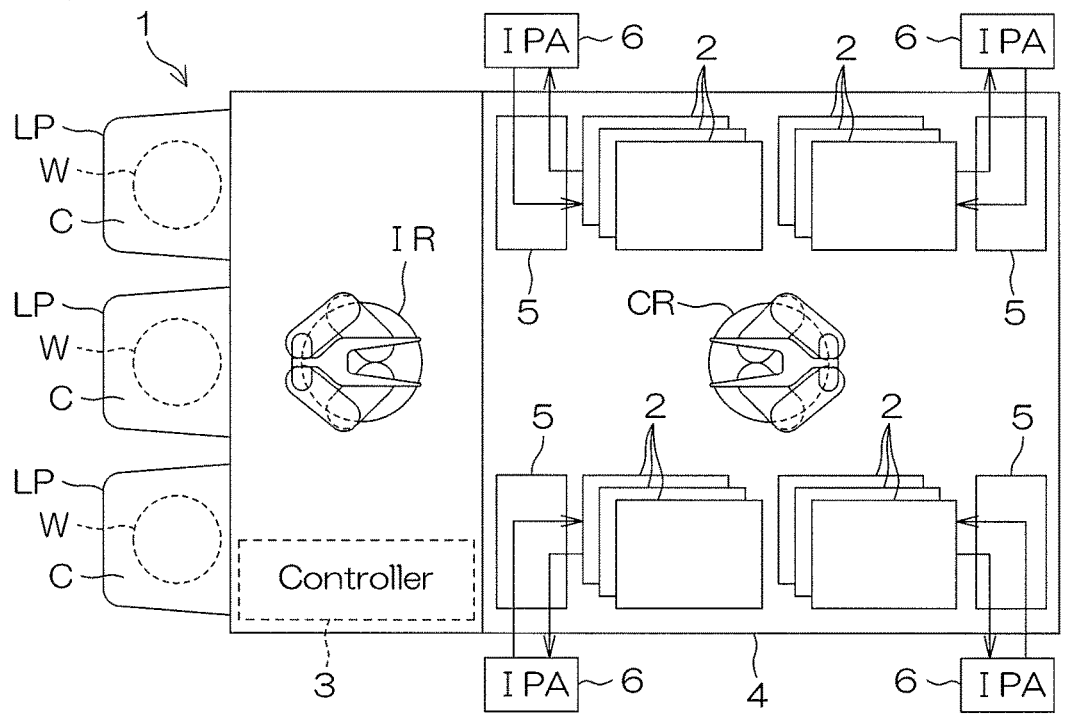
FIG. 1 is a schematic view of a substrate processing apparatus according to a first preferred embodiment of the present invention when viewed from above.

FIG. 1 is a schematic view of a substrate processing apparatus 1 according to the first preferred embodiment of the present invention when viewed from above.

The substrate processing apparatus 1 is a single substrate processing type substrate processing apparatus which processes one by one a circular-disk shaped substrate W such as a semiconductor wafer. The substrate processing apparatus 1 includes a plurality of load ports LP which hold a plurality of carriers C, each of which houses the substrate W, a plurality (for example, 12 units) of processing units 2, each of which processes the substrates W transferred from the plurality of load ports LP by a processing liquid such as a chemical liquid, and an indexer robot IR and a center robot CR which transfer the substrate W between the plurality of load ports LP and the plurality of processing units 2. The substrate processing apparatus 1 further includes a controller 3 which controls the substrate processing apparatus 1. The controller 3 is a computer which includes an arithmetic portion and a storage portion.

The substrate processing apparatus 1 includes a plurality (4 units) of valve boxes 5, each of which houses a first discharge valve 40, etc., which will be described below. The processing unit 2 and the valve box 5 are arranged in an outer wall 4 of the substrate processing apparatus 1 and covered with the outer wall 4 of the substrate processing apparatus 1. A plurality (4 units) of retention boxes 6, each of which houses a first retention tank 31, etc., which will be described below, are arranged outside the outer wall 4 of the substrate processing apparatus 1. The retention box 6 may be arranged on a side of the substrate processing apparatus 1 or may be arranged below (underground) a clean room in which the substrate processing apparatus 1 is installed.

Twelve units of the processing units 2 make up four towers arranged so as to surround the center robot CR in a plan view. Each of the towers is constituted with three units of the processing units 2 stacked vertically. The four retention boxes 6 correspond to the four towers, respectively. The four valve boxes 5 correspond to the four retention boxes 6, respectively. A processing liquid inside the retention box 6 is supplied to three units of the corresponding processing units 2 via a corresponding valve box 5. Further, the processing liquid supplied to the substrate W by the three units of the processing units 2 which constitute the same tower is recovered in a corresponding retention box 6 via a corresponding valve box 5.

Figure 2:
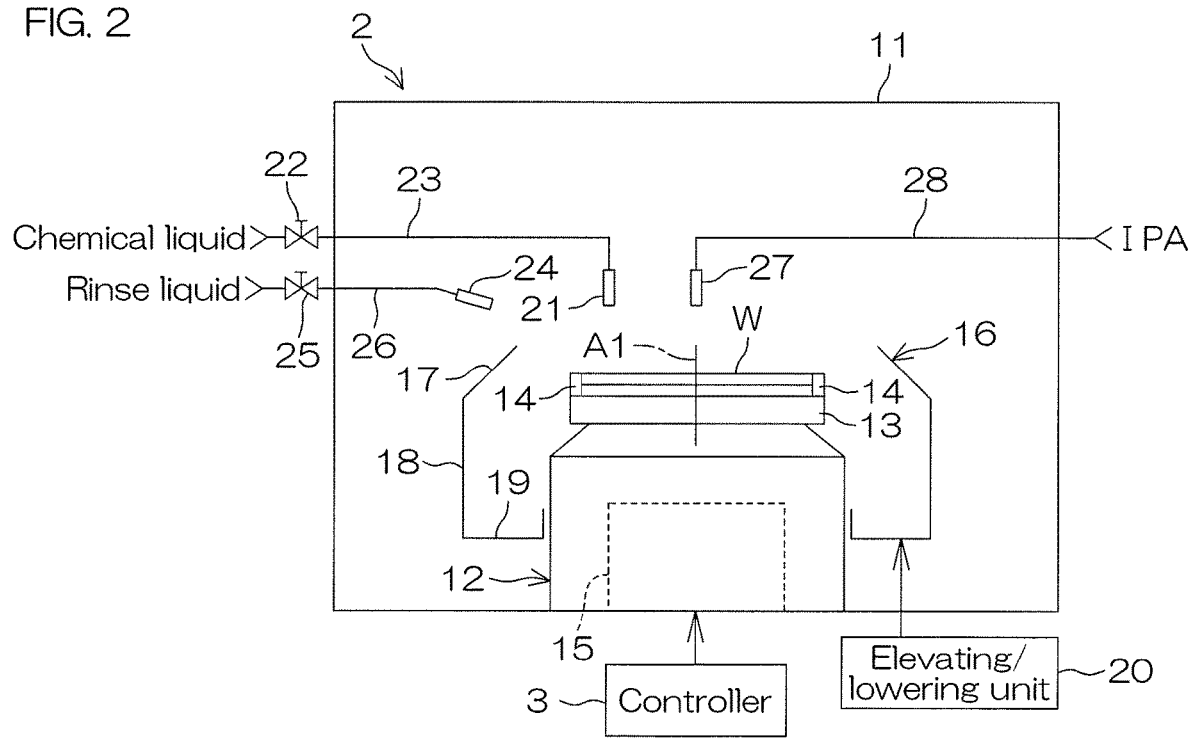
FIG. 2 is a schematic view of the interior of a processing unit included in the substrate processing apparatus when viewed horizontally.

FIG. 2 is a schematic view of the interior of the processing unit 2 when viewed horizontally.

The processing unit 2 includes a box-shaped chamber 11, a spin chuck 12 which rotates a substrate W inside the chamber 11 around a vertical rotational axis A1 passing through a central portion of the substrate W while holding the substrate W horizontally, and a cylindrical cup 16 which receives a processing liquid expelled from the substrate W.

The spin chuck 12 includes a circular-disk shaped spin base 13 which is held in a horizontal posture, a plurality of chuck pins 14 which hold the substrate W in a horizontal posture above the spin base 13 and a spin motor 15 which rotates the substrate W around the rotational axis A1 by rotating the plurality of chuck pins 14. The spin chuck 12 is not limited to a clamping type chuck which brings the plurality of chuck pins 14 into contact with a peripheral end surface of the substrate W but may be a vacuum type chuck which holds the substrate W horizontally by allowing a rear surface (lower surface) of the substrate W, as a non-device-forming surface to be adsorbed on an upper surface of the spin base 13.

The cup 16 includes a cylindrical inclined portion 17 which extends obliquely upward toward the rotational axis A1, a cylindrical guide portion 18 which extends downward from a lower portion end (outer end portion end) of the inclined portion 17 and a liquid receiving portion 19 which defines an annular groove which is opened upward. The inclined portion 17 includes a circular-ring shaped upper end having an inner diameter larger than the substrate W and the spin base 13. The upper end of the inclined portion 17 corresponds to an upper end of the cup 16. The upper end of the cup 16 surrounds the substrate W and the spin base 13 in a plan view.

The processing unit 2 includes a cup elevating/lowering unit 20 which elevates/lowers the cup 16 vertically between an upper position (the position indicated in FIG. 2) at which the upper end of the inclined portion 17 is positioned above a position at which the substrate W held by the spin chuck 12 is disposed and a lower position at which the upper end of the inclined portion 17 is positioned below the position at which the substrate W held by the spin chuck 12 is disposed. When a processing liquid is supplied to the substrate W, the cup 16 is arranged at the upper position. A processing liquid scattered outward from the substrate W is received by the inclined portion 17 and, thereafter, collected into the liquid receiving portion 19 by the guide portion 18.

The processing unit 2 includes a chemical liquid nozzle 21 which discharges downward a chemical liquid toward an upper surface of the substrate W held by the spin chuck 12. The chemical liquid nozzle 21 is connected to chemical liquid piping 23 in which a chemical liquid valve 22 is interposed. The processing unit 2 may be provided with a nozzle movement unit which causes the chemical liquid nozzle 21 to move horizontally between a processing position at which a chemical liquid discharged from the chemical liquid nozzle 21 is supplied to the substrate W and a standby position at which the chemical liquid nozzle 21 is kept away from the substrate W in a plan view.

When the chemical liquid valve 22 is opened, a chemical liquid is supplied from the chemical liquid piping 23 to the chemical liquid nozzle 21 and discharged through the chemical liquid nozzle 21. The chemical liquid is, for example, hydrofluoric acid. The chemical liquid is not limited to hydrofluoric acid but may be a liquid containing at least one of sulfuric acid, acetic acid, nitric acid, hydrochloric acid, phosphoric acid, ammonia water, hydrogen peroxide water, an organic acid (such as citric acid or oxalic acid), organic alkali (such as TMAH: tetramethylammonium hydroxide), a surfactant and a corrosion preventing agent.

The processing unit 2 includes a rinse liquid nozzle 24 which discharges downward a rinse liquid toward an upper surface of the substrate W held by the spin chuck 12. The rinse liquid nozzle 24 is connected to rinse liquid piping 26 in which a rinse liquid valve 25 is interposed. The processing unit 2 may be provided with a nozzle movement unit which causes the rinse liquid nozzle 24 to move horizontally between a processing position at which a rinse liquid discharged through the rinse liquid nozzle 24 is supplied to the substrate W and a standby position at which the rinse liquid nozzle 24 is kept away from the substrate W in a plan view.

When the rinse liquid valve 25 is opened, a rinse liquid is supplied from the rinse liquid piping 26 to the rinse liquid nozzle 24 and discharged through the rinse liquid nozzle 24. The rinse liquid is, for example, pure water (deionized water). The rinse liquid is not limited to pure water and may be any one of carbonated water, electrolysis ionized water, hydrogen water, ozone-treated water and hydrochloric acid water with a diluted concentration (for example, about 10 to 100 ppm).

The processing unit 2 includes an IPA nozzle 27 which discharges downward IPA toward an upper surface of the substrate W held by the spin chuck 12. The IPA nozzle 27 is connected to IPA piping 28. The processing unit 2 may be provided with a nozzle movement unit which causes the IPA nozzle 27 to move between a processing position at which IPA discharged through the IPA nozzle 27 is supplied to the substrate Wand a standby position at which the IPA nozzle 27 is kept away from the substrate W in a plan view.

When the substrate W is processed by the processing unit 2, the controller 3 causes the spin chuck 12 to hold and rotate the substrate W carried into the chamber 11 by the center robot CR (refer to FIG. 1). In this state, the controller 3 opens the chemical liquid valve 22, thereby allowing the chemical liquid nozzle 21 to discharge hydrofluoric acid as one example of a chemical liquid toward an upper surface of the rotating substrate W. Accordingly, hydrofluoric acid is supplied to an entire region of the upper surface of the substrate W to remove foreign matter such as particles from the substrate W (chemical liquid supplying process). Hydrofluoric acid scattered around the substrate W is received on an inner peripheral surface of the cup 16 positioned at the upper position.

The controller 3 closes the chemical liquid valve 22 and allows the chemical liquid nozzle 21 to stop the discharge of hydrofluoric acid and, thereafter, opens the rinse liquid valve 25, thereby allowing the rinse liquid nozzle 24 to discharge pure water as one example of a rinse liquid toward the rotating substrate W. Accordingly, pure water is supplied to an entire region of the upper surface of the substrate W, and hydrofluoric acid adhering to the substrate W is rinsed off (rinse liquid supplying process). The pure water scattered around the substrate W is received on an inner peripheral surface of the cup 16 positioned at the upper position.

The controller 3 closes the rinse liquid valve 25 and allows the rinse liquid nozzle 24 to stop the discharge of pure water, thereafter, allowing the IPA nozzle 27 to discharge IPA toward the rotating substrate W. At the start of supplying IPA, a liquid mainly composed of pure water is expelled from the substrate W and received on the inner peripheral surface of the cup 16 positioned at the upper position. After a predetermined period of time elapsed from the start of supplying IPA, pure water on the substrate W is replaced with IPA to form a liquid film of IPA which covers an entire region of the upper surface of the substrate W (IPA supplying process). Therefore, IPA having a very small quantity of dissolved pure water is expelled from the substrate W and received on the inner peripheral surface of the cup 16 positioned at the upper position.

The controller 3 allows the IPA nozzle 27 to stop the discharge of IPA and, thereafter, allows the spin chuck 12 to rotate the substrate W at a high velocity. Thereby, IPA on the substrate W is scattered around the substrate W by a centrifugal force. Therefore, IPA is removed from the substrate W to dry the substrate W (drying process). Then, the controller 3 allows the spin chuck 12 to stop the rotation of the substrate W and, thereafter, allows the center robot CR (refer to FIG. 1) to carryout the substrate W from the chamber 11. The controller 3 repeats a series of processes from the chemical liquid supplying process to the drying process, thereby allowing the substrate processing apparatus 1 to process a plurality of substrates W.

Figure 3:
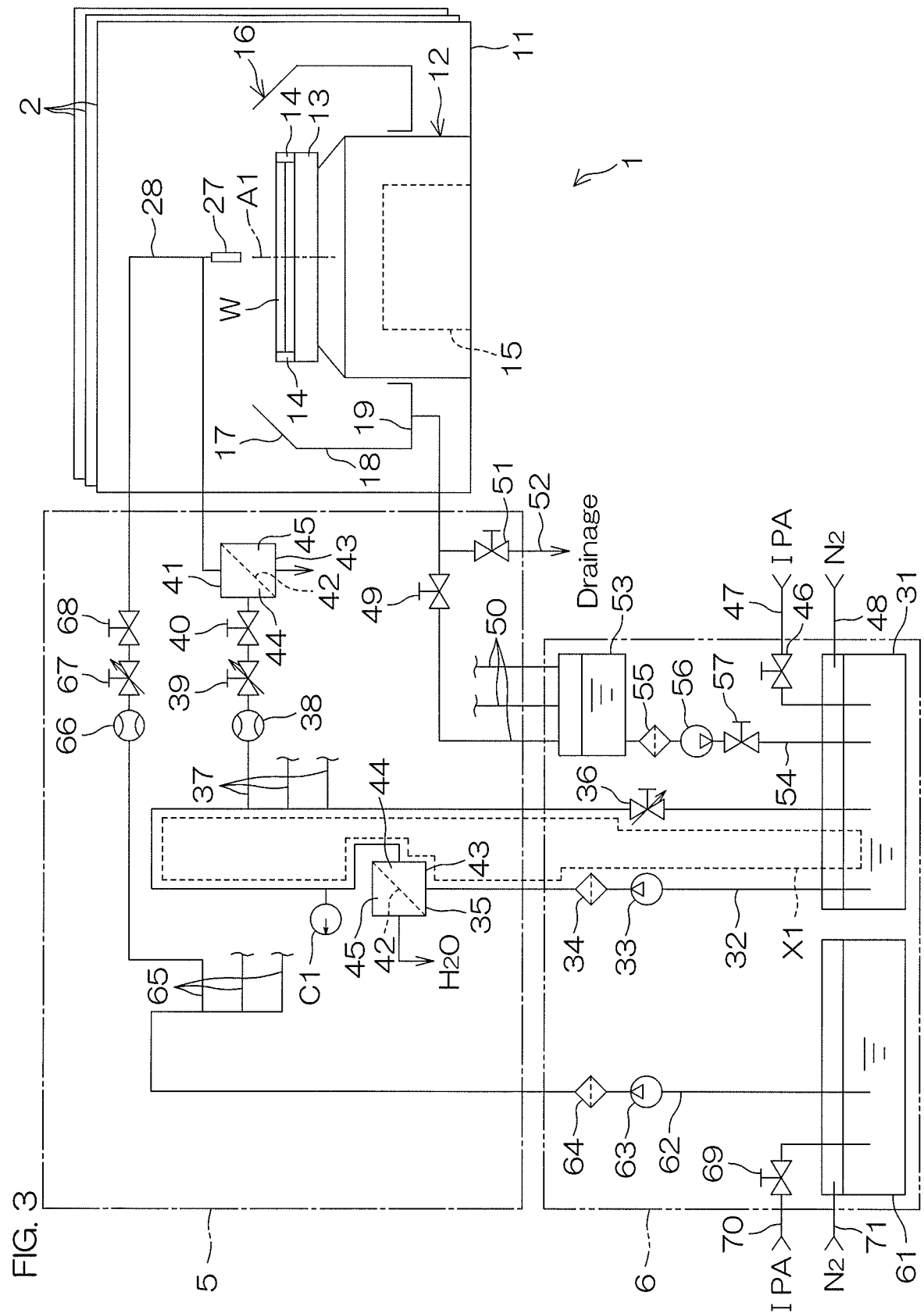
FIG. 3 is a schematic view showing an IPA supplying system and an IPA recovery system of the substrate processing apparatus.

FIG. 3 is a schematic view showing the IPA supplying system and the IPA recovery system of the substrate processing apparatus 1. In FIG. 3, the valve box 5 is indicated by a single dot & dashed line, and the retention box 6 is indicated by a double dot & dashed line. Members arranged at a region surrounded by the single dot & dashed line are arranged inside the valve box 5, and members arranged at a region surrounded by the double dot & dashed line are arranged inside the retention box 6. The same is applied to FIG. 6 which will be described below.

The first IPA supplying system of the substrate processing apparatus 1 includes a first retention tank 31 which retains IPA supplied to the substrate W. The second IPA supplying system of the substrate processing apparatus 1 includes a second retention tank 61 which retains IPA supplied to the substrate W. The first retention tank 31 is a recovered-liquid tank which retains IPA recovered from the substrate W. The second retention tank 61 is a new liquid tank which retains IPA which is not yet used and not supplied to the substrate W. The IPA which is not yet used means high-purity IPA which is not supplied to the substrate W by the substrate processing apparatus 1. The purity of IPA which is retained in the second retention tank 61 is higher than that of IPA which is retained in the first retention tank 31. The purity of IPA which is not yet used is 99.8 wt % or higher, for example.

The first IPA supplying system and the IPA recovery system will be hereinafter described and, thereafter, the second IPA supplying system will be described.

The first retention tank 31 is connected to first circulation piping 32 which defines an annular circulation channel X1 to circulate IPA inside the first retention tank 31. A first pump 33 which feeds IPA inside the first retention tank 31 to the first circulation piping 32 and a first filter 34 which removes foreign matter such as particles from IPA flowing inside the first circulation piping 32 are interposed in the first circulation piping 32.

Further, a first upstream dehydration unit 35 which removes moisture from the IPA flowing inside the first circulation piping 32 and a first pressure adjustment valve 36 which keeps constant a liquid pressure inside the first circulation piping 32 are interposed in the first circulation piping 32. The first pump 33 feeds constantly the IPA inside the first retention tank 31 into the first circulation piping 32. The first upstream dehydration unit 35 is arranged at a downstream side of the first pump 33, and the first pressure adjustment valve 36 is arranged at a downstream side of the first upstream dehydration unit 35.

The first circulation piping 32 is connected to first supply piping 37 which guides IPA from the first circulation piping 32 toward the IPA nozzle 27. The first supply piping 37 is connected to the first circulation piping 32 at a downstream side of the first upstream dehydration unit 35 and also at an upstream side of the first pressure adjustment valve 36. Similarly, two lines of the first supply piping 37 which correspond to other two processing units 2 that constitute the same tower are connected to the first circulation piping 32. IPA inside the same tank (first retention tank 31) is supplied to three processing liquid units which constitute the same tower.

A first flow meter 38 which measures a flow rate of the IPA flowing inside the first supply piping 37 toward the IPA nozzle 27 and a first flow regulating valve 39 which changes a flow rate of the IPA flowing inside the first supply piping 37 toward the IPA nozzle 27 are interposed in the first supply piping 37. Further, a first discharge valve 40 which opens and closes the first supply piping 37 and a first downstream dehydration unit 41 which removes moisture from the IPA flowing inside the first supply piping 37 toward the IPA nozzle 27 are interposed in the first supply piping 37. When the first discharge valve 40 is opened, the IPA inside the first circulation piping 32 is dehydrated by the first downstream dehydration unit 41 and, thereafter, discharged through the IPA nozzle 27.

The first upstream dehydration unit 35 and the first downstream dehydration unit 41 each include a separation membrane 42 which separates moisture from IPA and a dehydration housing 43 which houses the separation membrane 42. The separation membrane 42 is a dehydration membrane through which water can pass but IPA cannot pass. The separation membrane 42 may be a high polymer membrane made with a high polymer material or an inorganic membrane made with an inorganic material or may be membranes made with other materials. A specific example of the separation membrane 42 is a zeolite membrane made with zeolite.

The dehydration housing 43 includes a concentration chamber 44 and a permeation chamber 45 which are partitioned from each other by the separation membrane 42. The concentration chamber 44 is connected to the first circulation piping 32 or the first supply piping 37 not via the separation membrane 42. The permeation chamber 45 is connected to a vacuum pump which reduces a pressure of the permeation chamber 45. IPA flows into the concentration chamber 44 through a mixed-liquid supplying port and is, thereafter, expelled via a concentrated-liquid expelling port from the concentration chamber 44. Water contained in the IPA supplied to the concentration chamber 44 moves to the permeation chamber 45 via the separation membrane 42 due to a difference in pressure between the concentration chamber 44 and the permeation chamber 45. Water which has moved to the permeation chamber 45 is expelled from the permeation chamber 45 via a permeated-composition expelling port.

When the first discharge valve 40 is closed, the IPA inside the first retention tank 31 circulates through the first retention tank 31 and the circulation channel X1 which is formed with the first circulation piping 32. In the meantime, the IPA is repeatedly dehydrated by the first upstream dehydration unit 35 (upstream dehydration process). The IPA inside the first retention tank 31 is increased in purity up to, for example, 99 wt % or higher by this dehydration. Detection values obtained by a concentration meter C1 which detects moisture concentrations of the IPA dehydrated by the first upstream dehydration unit 35 are input into the controller 3. When the first discharge valve 40 is opened, the IPA which has been dehydrated by the first upstream dehydration unit 35 is dehydrated by the first downstream dehydration unit 41 before being supplied to the IPA nozzle 27 (downstream dehydration process). Therefore, it is possible to further increase the purity of the IPA supplied to the substrate W.

The first retention tank 31 is connected to first new liquid piping 47 to guide IPA which is not yet used. When the first new liquid valve 46 which is interposed in the first new liquid piping 47 is opened, the IPA which is not yet used is supplied from the first new liquid piping 47 to the first retention tank 31. When a remaining quantity of the IPA inside the first retention tank 31 reaches a reference value, the IPA which is not yet used is refilled via the first new liquid piping 47 into the first retention tank 31. Further, when the number of times of using IPA or use time thereof exceeds a reference value, the IPA inside the first retention tank 31 is partially or entirely exchanged with the IPA supplied via the first new liquid piping 47.

The first retention tank 31 is connected to first gas supply piping 48 which guides nitrogen gas as an example of inert gas. The nitrogen gas is constantly supplied into the first retention tank 31. Although not illustrated, the gas inside the first retention tank 31 is expelled via exhaust piping connected to the first retention tank 31. A pressure inside the first retention tank 31 is kept constant by a relief valve which is interposed in the exhaust piping. A space inside the first retention tank 31 is filled with the nitrogen gas. Thereby, moisture contained in air inside the first retention tank 31 can be suppressed or prevented from dissolving into IPA, thereby suppressing a decrease in purity of the IPA.

The IPA recovery system of the substrate processing apparatus 1 includes upstream recovery piping 50 which guides IPA expelled from the cup 16, an intermediate tank 53 to which IPA is supplied from the upstream recovery piping 50, and first downstream recovery piping 54 which guides IPA from the intermediate tank 53 to the first retention tank 31. The upstream recovery piping 50 extends from the cup 16 to the intermediate tank 53. The upstream recovery piping 50 is connected to the intermediate tank 53. Similarly, two lines of the upstream recovery piping 50 which correspond to the other two processing units which constitute the same tower are connected to the intermediate tank 53.

Drain piping 52 which expels IPA from the upstream recovery piping 50 is connected to the upstream recovery piping 50. An upstream recovery valve 49 which opens and closes the upstream recovery piping 50 is interposed in the upstream recovery piping 50, and a drain valve 51 which opens and closes the drain piping 52 is interposed in the drain piping 52. The drain piping 52 is connected to the upstream recovery piping 50 at an upstream side of the upstream recovery valve 49. When the upstream recovery valve 49 is opened and the drain valve 51 is closed, IPA inside the cup 16 is supplied via the upstream recovery piping 50 to the intermediate tank 53. In contrast thereto, when the drain valve 51 is opened and the upstream recovery valve 49 is closed, the IPA inside the cup 16 is expelled via the upstream recovery piping 50 to the drain piping 52.

First downstream recovery piping 54 extends from the intermediate tank 53 to the first retention tank 31. A recovery filter 55 which removes foreign matter from the first downstream recovery piping 54, a recovery pump 56 which feeds IPA from the intermediate tank 53 to the first retention tank 31 and a downstream recovery valve 57 which opens and closes the first downstream recovery piping 54 are interposed in the first downstream recovery piping 54. When the downstream recovery valve 57 is opened, IPA inside the intermediate tank 53 is fed by the recovery pump 56 to the first retention tank 31.

The IPA inside the intermediate tank 53 is purified by a recovery filter 55 and, thereafter, supplied to the first retention tank 31. The recovery filter 55 is, for example, a filter which removes ions such as metal ions. The recovery filter 55 includes an ion exchange resin which removes ions and a filter housing which houses the ion exchange resin. The recovery filter 55 may be a filter which removes solids such as particles, as with the first filter 34.

Next, a description will be given of the second IPA supplying system.

A second retention tank 61 is connected to second liquid-feeding piping 62 which guides IPA fed from the second retention tank 61. A second pump 63 which feeds IPA inside the second retention tank 61 to the second liquid feeding piping 62 and a second filter 64 which removes foreign matter such as particles from IPA flowing inside the second liquid-feeding piping 62 are interposed in the second liquid-feeding piping 62. The second pump 63 constantly feeds the IPA inside the second retention tank 61 into the second liquid feeding piping 62.

The second liquid-feeding piping 62 is connected to second supply piping 65 which guides IPA from the second liquid-feeding piping 62 to an IPA nozzle 27. Similarly, two lines of second supply piping 65 which correspond to the other two processing units 2 that constitute the same tower are connected to the second liquid-feeding piping 62. A second flow meter 66 which measures a flow rate of IPA flowing inside the second supply piping 65 toward the IPA nozzle 27, a second flow regulating valve 67 which changes a flow rate of the IPA flowing inside the second supply piping 65 toward the IPA nozzle 27 and a second discharge valve 68 which opens and closes the second supply piping 65 are interposed in the second supply piping 65.

The second retention tank 61 is connected to second new liquid piping 70 in which a second new liquid valve 69 is interposed. When the second new liquid valve 69 is opened, IPA which is not yet used is supplied from the second new liquid piping 70 to the second retention tank 61. The second retention tank 61 is further connected to second gas supply piping 71 which constantly supplies nitrogen gas to the second retention tank 61. Although not illustrated, the gas inside the second retention tank 61 is expelled via exhaust piping connected to the second retention tank 61. A pressure inside the second retention tank 61 is kept constant by a relief valve interposed in the exhaust piping. A space inside the second retention tank 61 is filled with nitrogen gas.

Figure 4:
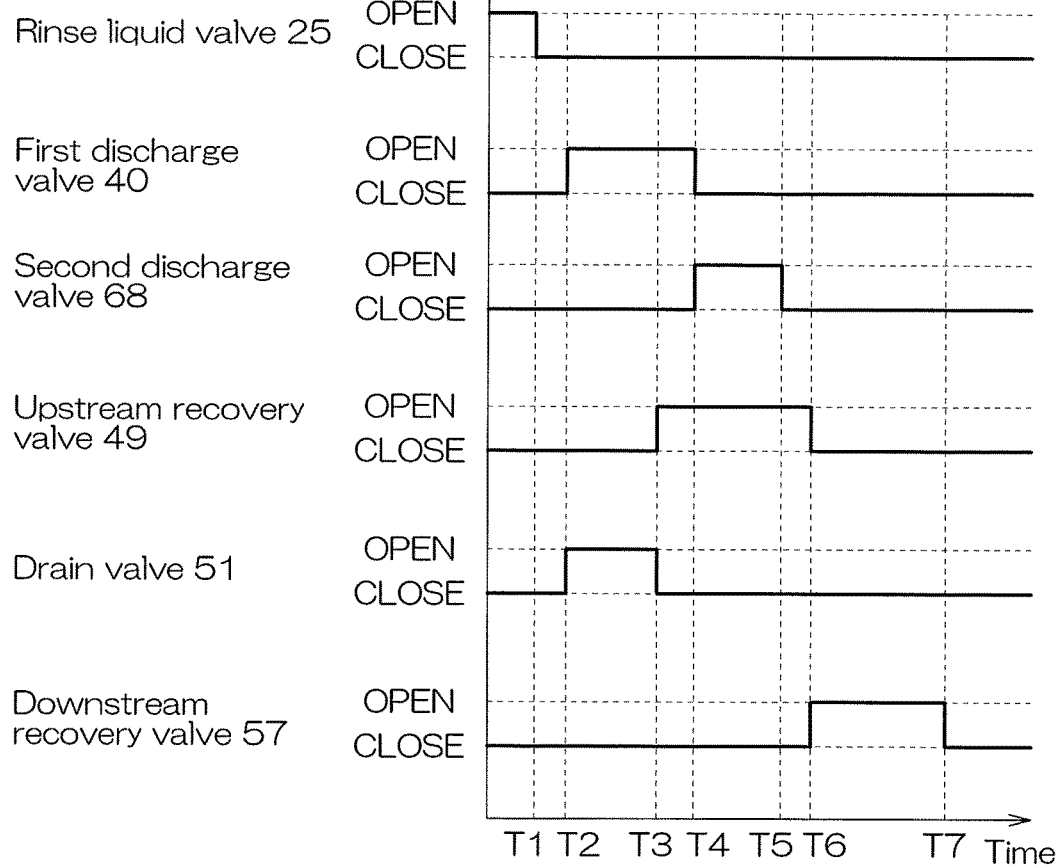
FIG. 4 is a time chart showing operation of the substrate processing apparatus during a period of time from before an IPA supplying process to after the IPA supplying process.

FIG. 4 is a time chart showing operation of the substrate processing apparatus 1 during a period of time from before an IPA supplying process to after the IPA supplying process. Hereinafter, FIG. 3 and FIG. 4 will be referred to.

As shown in FIG. 4, after the rinse liquid valve 25 is closed at Time T1, the first discharge valve 40 is opened at Time T2. Thereby, the supply of IPA is started from the first retention tank 31 to the IPA nozzle 27, and IPA supplied from the first retention tank 31 is discharged through the IPA nozzle 27.

At Time T2, the upstream recovery valve 49 is closed and the drain valve 51 is opened. Therefore, at the start of supplying IPA to the substrate W, a liquid received by the cup 16, that is, a mixed liquid of pure water and IPA which is mainly composed of pure water, is not supplied to the intermediate tank 53 but expelled to the drain piping 52 (drain process). Therefore, it is possible to prevent the supply of IPA high in moisture concentration to the intermediate tank 53.

After a certain period of time elapsed from opening of the first discharge valve 40, the upstream recovery valve 49 is opened and the drain valve 51 is closed (Time T3). Therefore, a liquid received by the cup 16 is not expelled to the drain piping 52 but supplied to the intermediate tank 53. At Time T3, a certain period of time has passed from the start of supplying IPA, and pure water on the substrate W is replaced with IPA. Thus, IPA having a very small quantity of dissolved pure water is expelled from the substrate W. Therefore, IPA relatively high in purity is supplied to the intermediate tank 53.

Further, after a certain period of time elapsed from opening of the first discharge valve 40, the first discharge valve 40 is closed and the second discharge valve 68 is opened (Time T4). Thereby, supply of IPA from the first retention tank 31 to the IPA nozzle 27 is stopped. On the other hand, supply of IPA from the second retention tank 61 to the IPA nozzle 27 is started, and the IPA supplied from the second retention tank 61 is discharged from the IPA nozzle 27. A period of time during which the first discharge valve 40 is opened may be longer or shorter than a period of time during which the second discharge valve 68 is opened and may be equal to a period of time during which the second discharge valve 68 is opened.

After a certain period of time elapsed from opening of the second discharge valve 68, the second discharge valve 68 is closed (Time T5). Thereby, supply of IPA from the second retention tank 61 to the IPA nozzle 27 is stopped and supply of IPA to the substrate W is stopped. Thereafter, the drying process described above is executed. The upstream recovery valve 49 is closed after closing of the second discharge valve 68 so as to supply IPA remaining inside the cup 16 to the intermediate tank 53 after the IPA nozzle 27 has stopped the discharge of IPA (Time T6).

The downstream recovery valve 57 is kept closed until Time T6. Therefore, IPA supplied to the substrate W is retained in the intermediate tank 53 from Time T3 to Time T6 (retention process). At Time T6 when the downstream recovery valve 57 is opened, the IPA retained in the intermediate tank 53 is supplied to the first retention tank 31 (supplying process). Thereby, the IPA supplied to the substrate W is recovered in the first retention tank 31 (recovery process). The recovered IPA is dehydrated by the first upstream dehydration unit 35 until start of the next processing of the substrate W. Further, after a certain period of time elapsed from opening of the downstream recovery valve 57, the downstream recovery valve 57 is closed (Time T7).

As described above, since IPA after use which has been supplied to the substrate W is recovered in the first retention tank 31 and again used, it is possible to decrease the consumption of IPA. Further, although IPA with an increased moisture concentration is recovered in the first retention tank 31, the moisture of IPA is removed by the first upstream dehydration unit 35 and the first downstream dehydration unit 41, thus making it possible to suppress or prevent IPA high in moisture concentration from being supplied to the substrate W. In addition, after discharge of IPA to the substrate W is stopped, IPA which has been used is recovered in the first retention tank 31. It is therefore possible to prevent a decrease in purity of IPA to be discharged through the IPA nozzle 27 during supply of the IPA.

Figure 5:
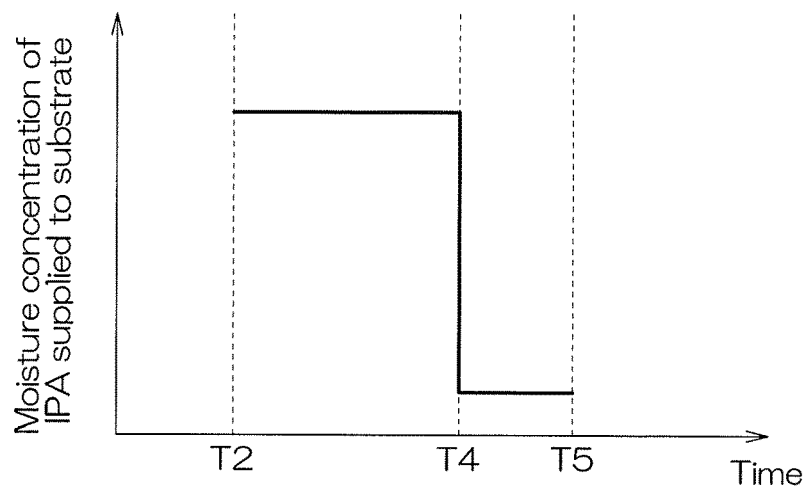
FIG. 5 is a graph showing a change in moisture concentrations of IPA supplied to the substrate.

FIG. 5 is a graph showing a change in moisture concentration of IPA supplied to the substrate W. Time shown in FIG. 5 coincides with time shown in FIG. 4.

As described above, in the IPA supplying process, IPA inside the first retention tank 31 is supplied to the substrate W (first IPA supplying process) and, thereafter, IPA inside the second retention tank 61 is supplied to the substrate W (second IPA supplying process). The IPA inside the first retention tank 31 is IPA which has been recovered and dehydrated, and the IPA inside the second retention tank 61 is IPA which is not yet used and lower in moisture concentration than the IPA inside the first retention tank 31. Therefore, as shown in FIG. 5, moisture concentrations of IPA supplied to the substrate W are decreased in stages, and IPA which is not yet used and extremely low in moisture concentration is supplied to the substrate W at the end of the IPA supplying process.

If the moisture concentration of IPA is low at the end of supplying IPA despite the fact that the moisture concentration thereof is high at the start of supplying IPA, it is possible to reduce a quantity of water remaining in the substrate W after supply of IPA. Thereby, it is possible to suppress or prevent occurrence of abnormalities resulting from remaining moisture such as watermarks and pattern collapse. Further, as compared with a case where IPA low in moisture concentration is supplied from the beginning, the burden on dehydration can be eased and the first upstream dehydration unit 35 and the first downstream dehydration unit 41 are used efficiently. It is therefore possible to suppress an increase in the running cost of the substrate processing apparatus 1.

As described above, in the first preferred embodiment, after supply of pure water which is one example of a rinse liquid to the substrate W, IPA which has been recovered and dehydrated is supplied to the substrate W to which pure water is adhering. Thereafter, IPA which is not yet used and lower in moisture concentration than the IPA which has been recovered and dehydrated is supplied to the substrate W. Therefore, as compared with a case where IPA which is not yet used is supplied at the start of supplying IPA, IPA low in moisture concentration can be efficiently supplied to the substrate W. Thereby, it is possible to reduce a quantity of water remaining in the substrate W after supply of IPA and also possible to suppress or prevent occurrence of abnormalities resulting from remaining moisture such as watermarks and pattern collapse. Further, IPA is recovered in order to supply it to the substrate W, and it is thus possible to reduce consumption of IPA.

Further, in the first preferred embodiment, IPA which has been supplied to the substrate W at the start of supplying IPA, is not recovered but expelled. IPA which has been supplied to the substrate W at the start of supplying IPA is expelled together with a rinse liquid from the substrate W. At this time, a liquid expelled from the substrate W contains the rinse liquid at a high percentage. IPA which has been supplied to the substrate W at the start of supplying IPA is not recovered but expelled. Therefore, it is possible to suppress or prevent IPA high in moisture concentration from being recovered.

Still further, in the first preferred embodiment, IPA which has been supplied to the substrate W is retained in the intermediate tank 53. Then, after supply of IPA to the substrate W is stopped, IPA inside the intermediate tank 53 is supplied to the first retention tank 31. If IPA after use is mixed with IPA inside the first retention tank 31 during supply of the IPA, IPA which is to be supplied to the substrate W is decreased in purity. Therefore, after supply of IPA to the substrate W is stopped, the IPA after use is recovered in the first retention tank 31, thus making it possible to prevent a decrease in purity of IPA supplied to the substrate W during supply of the IPA.

In addition, in the first preferred embodiment, IPA inside the first retention tank 31 circulates through the circulation channel X1 formed with the first retention tank 31 and the first circulation piping 32. In the meantime, the IPA is repeatedly dehydrated by the first upstream dehydration unit 35. The IPA inside the first retention tank 31 is dehydrated not only by the first upstream dehydration unit 35 but also by the first downstream dehydration unit 41 and, thereafter, supplied to the IPA nozzle 27. Therefore, it is possible to further reduce a moisture concentration of the IPA supplied to the substrate W.

Second Preferred Embodiment

Then, a description will be given of the second preferred embodiment of the present invention.

Figure 6:
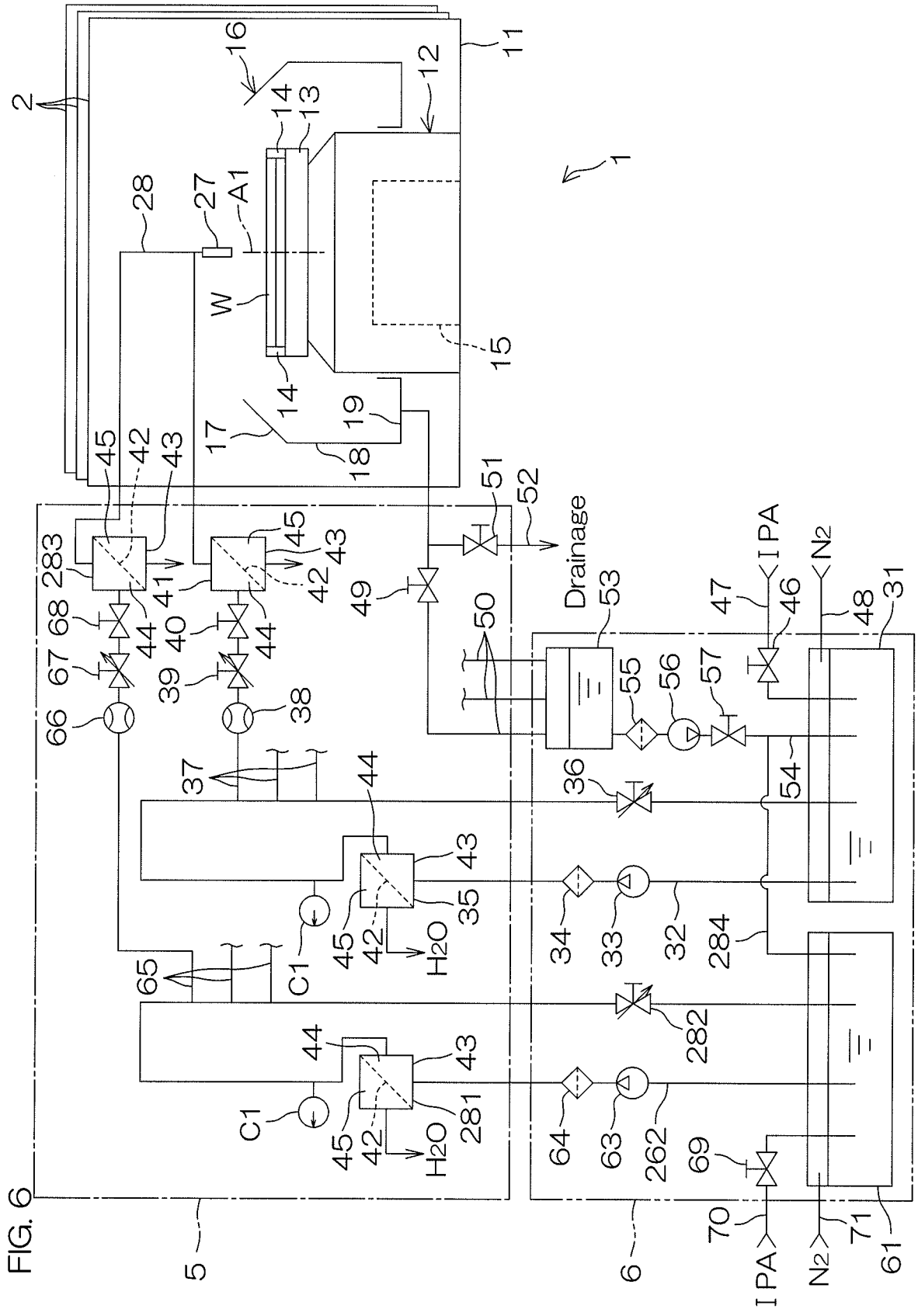
FIG. 6 is a schematic view showing an IPA supplying system and an IPA recovery system of a substrate processing apparatus according to a second preferred embodiment of the present invention.

FIG. 6 is a schematic view showing an IPA supplying system and an IPA recovery system of the substrate processing apparatus 1 according to the second preferred embodiment of the present invention. In FIG. 6, the same configuration portions as individual portions shown in FIG. 1 to FIG. 5 are given the same reference numbers as those of FIG. 1, etc., with a description thereof being omitted.

In the first preferred embodiment, IPA which is not yet used is retained in the second retention tank 61, while in the second preferred embodiment, IPA which has been recovered and dehydrated is retained in a second retention tank 61.

Specifically, the second IPA supplying system includes second circulation piping 262 which defines an annular circulation channel to circulate IPA inside the second retention tank 61 in place of the second liquid feeding piping 62 according to the first preferred embodiment. A second pump 63, a second filter 64 and a second pressure adjustment valve 282 are interposed in the second circulation piping 262. A configuration and functions of the second pressure adjustment valve 282 are similar to those of the first pressure adjustment valve 36.

The second retention tank 61 is connected to second downstream recovery piping 284 which guides IPA expelled from the substrate W from first downstream recovery piping 54 to the second retention tank 61. When a downstream recovery valve 57 is opened, IPA inside an intermediate tank 53 is supplied to both a first retention tank 31 and the second retention tank 61. Therefore, IPA supplied to a substrate W is recovered by both the first retention tank 31 and the second retention tank 61.

A second upstream dehydration unit 281 which removes moisture from IPA flowing inside the second circulation piping 262 is interposed in the second circulation piping 262, and a second downstream dehydration unit 283 which removes moisture from IPA flowing inside the second supply piping 65 is interposed in the second supply piping 65. The second upstream dehydration unit 281 and the second downstream dehydration unit 283 are similar in configuration and functions to the first upstream dehydration unit 35 and the first downstream dehydration unit 41.

IPA inside the second retention tank 61 is lower in moisture concentration than IPA inside the first retention tank 31. IPA is changed in moisture concentration, depending on dehydration conditions such as a type of separation membrane 42, dehydration time and moisture concentrations of IPA which has been recovered. When the IPA inside the second retention tank 61 is lower in moisture concentration than the IPA inside the first retention tank 31, the second upstream dehydration unit 281 may be different in configuration and functions from the first upstream dehydration unit 35.

In the second preferred embodiment, as with the first preferred embodiment, there are performed a series of processes from a chemical liquid supplying process to a drying process. In an IPA supplying process, the IPA inside the first retention tank 31 is supplied to the substrate W (first IPA supplying process) and, thereafter, the IPA inside the second retention tank 61 is supplied to the substrate W (second IPA supplying process). The IPA inside the first retention tank 31 is IPA which has been recovered and dehydrated, while the IPA inside the second retention tank 61 is IPA which has been recovered and dehydrated and which is lower in moisture concentration than the IPA inside the first retention tank 31. Therefore, it is possible to efficiently supply IPA low in moisture concentration to the substrate W and also possible to reduce a quantity of water remaining in the substrate W after supply of the IPA.

Other Preferred Embodiments

The present invention is not restricted to the contents of the preferred embodiments described above and various modifications are possible within the scope of the present invention.

For example, the IPA nozzle 27 may be a nozzle other than a nozzle which forms a flow of IPA continuing from a discharge port of the IPA nozzle 27 to the upper surface of the substrate W. Specifically, the IPA nozzle 27 may be a two-fluid nozzle which causes a gas (for example, nitrogen gas) to collide with a liquid (IPA) to produce a plurality of droplets of IPA which collide onto the upper surface of the substrate W or may be an inkjet nozzle which ejects a plurality of droplets of IPA which collide onto the upper surface of the substrate W by imparting vibration to IPA by a piezoelectric element.

IPA discharged from the IPA nozzle 27 may be supplied to the substrate W through an opening provided at a lower surface central portion of a circular-disk shaped shielding plate having a greater outer diameter than a diameter of the substrate W or may be supplied to the substrate W through an opening provided on a lower surface of a gas discharge nozzle which is smaller than the substrate W in a plan view.

The shielding plate is able to move vertically between a standby position at which a hand of the center robot CR which holds the substrate W can advance into a space between an upper surface of the substrate W and a lower surface of the shielding plate and a processing position at which the lower surface of the shielding plate comes close to the upper surface of the substrate W to such a height that the hand of the center robot CR cannot advance into a space between the substrate W and the shielding plate. The gas discharge nozzle is a nozzle which radially discharges a gas at a position over an upper surface central portion of the substrate W, thereby forming an airflow covering the upper surface of the substrate W. The gas discharge nozzle is able to move horizontally between a processing position at which the gas discharge nozzle overlaps with the substrate W in a plan view and a standby position at which the gas discharge nozzle is kept away from the substrate W in a plan view.

A description has been given of a case where IPA inside the first retention tank 31 and that inside the second retention tank 61 are discharged through the same nozzle (IPA nozzle 27). However, they may be discharged from separate nozzles. That is, there may be provided a first IPA nozzle which discharges IPA supplied from the first retention tank 31 toward the substrate W and a second IPA nozzle which discharges IPA supplied from the second retention tank 61 toward the substrate W.

A description has been given of a case where IPA supplied from the first retention tank 31 to the substrate W and IPA supplied from the second retention tank 61 to the substrate W are supplied to the intermediate tank 53. Only the IPA supplied from the first retention tank 31 to the substrate W or only the IPA supplied from the second retention tank 61 to the substrate W may be supplied to the intermediate tank 53.

IPA which has been supplied to the substrate W at the start of supplying the IPA may be supplied to the intermediate tank 53 without being expelled to the drain piping 52. That is, IPA expelled from the substrate W may be supplied to the intermediate tank 53 at the start of supplying the IPA.

IPA supplied to the intermediate tank 53 may be recovered in at least one of the first retention tank 31 and the second retention tank 61 before supply of the IPA is stopped. Further, IPA expelled from the substrate W may be recovered in at least one of the first retention tank 31 and the second retention tank 61 not via the intermediate tank 53.

One of the first upstream dehydration unit 35 and the first downstream dehydration unit 41 may be omitted. Similarly, one of the second upstream dehydration unit 281 and the second downstream dehydration unit 283 may be omitted.

In the second preferred embodiment, for example, the first upstream dehydration unit 35 and the first downstream dehydration unit 41 may be omitted. That is, IPA which has been recovered but which is not dehydrated may be supplied to the substrate W to which a rinse liquid is adhering and, thereafter, IPA low in moisture concentration which has been recovered and dehydrated may be supplied to the substrate W. In this case, as compared with a case where IPA which has been recovered and dehydrated is supplied from the beginning, it is possible to efficiently supply IPA low in moisture concentration to the substrate W. Further, since IPA which has been recovered is supplied from the beginning, it is possible to further reduce consumption of IPA.

In the first preferred embodiment, the first upstream dehydration unit 35 and the first downstream dehydration unit 41 may also be omitted. That is, IPA which has been recovered but which is not dehydrated is supplied to the substrate W to which a rinse liquid is adhering and, thereafter, IPA which is not yet used may be supplied to the substrate W. In this case, as compared with a case where IPA which is not yet used is supplied from the beginning, it is possible to efficiently supply IPA low in moisture concentration to the substrate W. Further, neither the first upstream dehydration unit 35 nor the first downstream dehydration unit 41 is needed, thus making it possible to suppress an increase in manufacturing cost of the substrate processing apparatus 1.

The first upstream dehydration unit 35 may include an adsorbent which removes water dissolved in IPA instead of the separation membrane 44 or may include both the separation membrane 44 and the adsorbent. This is also applicable to the first downstream dehydration unit 41, the second upstream dehydration unit 281 and the second downstream dehydration unit 283. A specific example of the adsorbent is a zeolite adsorbent.

The substrate processing apparatus 1 is not limited to an apparatus that processes a disk-shaped substrate W and may be an apparatus that processes a polygonal substrate W.

Two or more of any of the arrangements described above may be combined. Two or more of any of the processes described above may be combined.

The present application corresponds to Japanese Patent Application No. 2015-161294 filed on Aug. 18, 2015 in the Japan Patent Office, and the entire disclosure of this application is incorporated herein by reference. While preferred embodiments of the present invention have been described in detail, it should be understood that these embodiments are merely illustrative of the technical principles of the present invention but not limitative of the invention. The spirit and scope of the present invention are to be limited only by the appended claims.

DESCRIPTION OF THE REFERENCE NUMERALS

1: Substrate processing apparatus
2: Processing unit
3: Controller
12: Spin chuck (substrate holding unit)
24: Rinse liquid nozzle (rinse liquid supplying unit)
25: Rinse liquid valve (rinse liquid supplying unit)
26: Rinse liquid piping (rinse liquid supplying unit)
27: IPA nozzle
28: IPA piping
31: First retention tank (retention tank)
32: First circulation piping (circulation piping)
35: First upstream dehydration unit (dehydration unit, upstream dehydration unit)
37: First supply piping (supply piping)
38: First flow meter
39: First flow regulating valve
40: First discharge valve
41: First downstream dehydration unit (dehydration unit, downstream dehydration unit)
42: Separation membrane
43: Dehydration housing
44: Concentration chamber
45: Permeation chamber
49: Upstream recovery valve (recovery unit)
50: Upstream recovery piping (recovery unit)
51: Drain valve (drain unit)
52: Drain piping (drain unit)
53: Intermediate tank (recovery unit)
54: First downstream recovery piping (recovery unit)
55: Recovery filter (recovery unit)
56: Recovery pump (recovery unit)
57: Downstream recovery valve (recovery unit)
61: Second retention tank (retention tank)
63: Second liquid feeding piping
65: Second supply piping (supply piping)
66: Second flow meter
67: Second flow regulating valve
68: Second discharge valve
262: Second circulation piping (circulation piping)
281: Second upstream dehydration unit (dehydration unit, upstream dehydration unit)
283: Second downstream dehydration unit (dehydration unit, downstream dehydration unit)
284: Second downstream recovery piping (recovery unit)
W: Substrate
X1: Circulation channel

What is claimed is:

1. A substrate processing method which supplies an IPA-containing liquid which contains isopropyl alcohol to a substrate held horizontally, the substrate processing method, comprising:
   a rinse liquid supplying process which supplies a rinse liquid containing water to the substrate;
   a first IPA supplying process which supplies an IPA-containing liquid to the substrate to which the rinse liquid is adhering after the rinse liquid supplying process;
   a second IPA supplying process which supplies, after the first IPA supplying process, the substrate with an IPA-containing liquid which is lower in moisture concentration than the IPA-containing liquid supplied in the first IPA supplying process;
   a recovery process which recovers the IPA-containing liquid supplied to the substrate in at least one of the first IPA supplying process and the second IPA supplying process; and
   a dehydration process which removes moisture from the IPA-containing liquid recovered in the recovery process, wherein
   the dehydration process includes an upstream dehydration process which removes moisture from an IPA-containing liquid inside a circulation piping which defines an annular circulation channel to circulate the IPA-containing liquid and a downstream dehydration process which removes moisture from the IPA-containing liquid inside a supply piping which guides the IPA-containing liquid from the circulation piping toward an IPA nozzle to discharge the IPA-containing liquid toward the substrate.

2. The substrate processing method according to claim 1, further comprising: a drain process which expels the IPA-containing liquid supplied to the substrate in the first IPA supplying process without recovering it before the recovery process.

3. The substrate processing method according to claim 1, wherein the recovery process includes a retention process which retains in an intermediate tank the IPA-containing liquid supplied to the substrate in at least one of the first IPA supplying process and the second IPA supplying process, and a supplying process which supplies after the first IPA supplying process and the second IPA supplying process the IPA-containing liquid inside the intermediate tank to a first retention tank which retains the IPA-containing liquid to be supplied in the first IPA supplying process.

4. The substrate processing method according to claim 1, further comprising: a dehydration process which removes moisture from the IPA-containing liquid recovered in the recovery process, wherein
   the first IPA supplying process supplies the substrate with an IPA-containing liquid which has been recovered and dehydrated, and
   the second IPA supplying system supplies the substrate with an IPA-containing liquid which is not yet used and lower in moisture concentration than the IPA-containing liquid supplied in the first IPA supplying process.

5. The substrate processing method according to claim 1, further comprising: a dehydration process which removes moisture from the IPA-containing liquid recovered in the recovery process, wherein
   the first IPA supplying process supplies the substrate with an IPA-containing liquid which has been recovered and dehydrated, and the second IPA supplying process supplies the substrate with an IPA-containing liquid which has been recovered and dehydrated and which is lower in moisture concentration than the IPA-containing liquid supplied in the first IPA supplying process.

6. The substrate processing method according to claim 1, wherein the first IPA supplying process supplies the substrate with an IPA-containing liquid which has been recovered but which is not dehydrated, and
the second IPA supplying process supplies the substrate with an IPA-containing liquid which is not yet used and lower in moisture concentration than the IPA-containing liquid supplied in the first IPA supplying process.

7. A substrate processing method which supplies an IPA-containing liquid which contains isopropyl alcohol to a substrate held horizontally, the substrate processing method, comprising:
   a rinse liquid supplying process which supplies a rinse liquid containing water to the substrate;
   a first IPA supplying process which supplies an IPA-containing liquid to the substrate to which the rinse liquid is adhering after the rinse liquid supplying process;
   a second IPA supplying process which supplies, after the first IPA supplying process, the substrate with an IPA-containing liquid which is lower in moisture concentration than the IPA-containing liquid supplied in the first IPA supplying process;
   a recovery process which recovers the IPA-containing liquid supplied to the substrate in at least one of the first IPA supplying process and the second IPA supplying process; and
   a dehydration process which removes moisture from some of the IPA-containing liquid recovered in the recovery process, wherein
the first IPA supplying process supplies the substrate with an IPA-containing liquid which has been recovered but which is not dehydrated, and
the second IPA supplying process supplies the substrate with an IPA-containing liquid which has been recovered and dehydrated and which is lower in moisture concentration than the IPA-containing liquid supplied in the first IPA supplying process.

* * * * *